US011343943B1

(12) United States Patent
Salvatore et al.

(10) Patent No.: US 11,343,943 B1
(45) Date of Patent: May 24, 2022

(54) HEAT DISSIPATION FOR POWER SWITCHES

(71) Applicant: ABB Schweiz AG, Baden (CH)

(72) Inventors: Giovanni Salvatore, Zollikerberg (CH); Slavo Kicin, Zürich (CH); Fabian Mohn, Ennetbaden (CH)

(73) Assignee: ABB SCHWEIZ AG, Baden (CH)

( * ) Notice: Subject to any disclaimer, the term of this patent is extended or adjusted under 35 U.S.C. 154(b) by 0 days.

(21) Appl. No.: 17/101,621

(22) Filed: Nov. 23, 2020

(51) Int. Cl.
*H05K 7/20* (2006.01)
*H03K 17/14* (2006.01)
*H01H 9/52* (2006.01)
*H01L 23/34* (2006.01)

(52) U.S. Cl.
CPC ......... *H05K 7/20409* (2013.01); *H03K 17/14* (2013.01); *H01H 9/52* (2013.01); *H01L 23/34* (2013.01)

(58) Field of Classification Search
CPC .... H05K 7/205; H05K 7/2039; H05K 1/0203; H05K 1/0204; H01L 23/34; H03K 17/14; H01H 9/52; H01H 45/12; H01H 50/12
See application file for complete search history.

(56) References Cited

U.S. PATENT DOCUMENTS

| 8,358,000 | B2 | 1/2013 | Beaupre et al. |
| 9,922,911 | B1 | 3/2018 | Park et al. |
| 10,032,689 | B2 | 7/2018 | Jeon et al. |
| 10,147,665 | B2 | 12/2018 | Park et al. |
| 2010/0097767 | A1 | 4/2010 | Jude et al. |
| 2013/0242631 | A1* | 9/2013 | Inayoshi ................ H05K 7/209 363/132 |
| 2018/0145007 | A1 | 5/2018 | Hatano et al. |
| 2018/0175010 | A1 | 6/2018 | Lee et al. |
| 2021/0398958 | A1* | 12/2021 | Salvatore ................ H02H 3/02 |
| 2021/0400815 | A1* | 12/2021 | Salvatore ................ H01L 21/50 |

FOREIGN PATENT DOCUMENTS

| CN | 107927936 A | 4/2018 |
| CN | 207252116 U | 4/2018 |
| CN | 108039341 A | 5/2018 |
| CN | 108133915 A | 6/2018 |

OTHER PUBLICATIONS

Alibaba, "Factory price wholesale ip67 aluminum heat sink enclosure," Product information sheet, 14 pp., available at https://www.alibaba.com/product-detail/Factory-price-wholesale-ip67-aluminum-heat_60646819673.html, last accessed Sep. 1, 2020.

\* cited by examiner

*Primary Examiner* — Zachary Pape
(74) *Attorney, Agent, or Firm* — Greenberg Traurig, LLP

(57) ABSTRACT

Systems, methods, techniques and apparatuses of power switches are disclosed. One exemplary embodiment is a power switch comprising an outer housing; a power electronics board disposed within the housing and including a semiconductor switch structured to selectively conduct a current between a first power terminal and a second power terminal; a first heat sink coupled to the power electronics board; a plurality of thermally conductive connectors; a second heat sink coupled to the plurality of thermally conductive connectors, a control electronics board structured to control the semiconductor switch, the control electronics board being located within an enclosure formed of the second heat sink, the plurality of thermally conductive connectors, and the power electronics board.

20 Claims, 2 Drawing Sheets

HEAT DISSIPATION FOR POWER SWITCHES

BACKGROUND

The present disclosure relates generally to heat dissipation in power switches. Many power systems include power switches structured to protect power system components from fault currents. In addition to needing to dissipate heat generated by opening the power switch, solid state-based power switches have an on-resistance, causing heat dissipation proportional to the current conducted by the power switch. Heat generated by the power switch must be dissipated before the internal temperature of the power switch exceeds the thermal ratings of the power switch components. Existing power switches suffer from a number of shortcomings and disadvantages. There remain unmet needs including reducing thermal stress on power switches and increasing the current rating of power switches. For instance, conventional power switch current ratings and fault mitigation operations are limited by the rate at which the power switch can dissipate generated heat. In view of these and other shortcomings in the art, there is a significant need for the apparatuses, methods, systems and techniques disclosed herein.

DISCLOSURE OF ILLUSTRATIVE EMBODIMENTS

For the purposes of clearly, concisely and exactly describing non-limiting exemplary embodiments of the disclosure, the manner and process of making and using the same, and to enable the practice, making and use of the same, reference will now be made to certain exemplary embodiments, including those illustrated in the figures, and specific language will be used to describe the same. It shall nevertheless be understood that no limitation of the scope of the present disclosure is thereby created, and that the present disclosure includes and protects such alterations, modifications, and further applications of the exemplary embodiments as would occur to one skilled in the art with the benefit of the present disclosure.

SUMMARY OF TIE DISCLOSURE

Exemplary embodiments of the disclosure include systems, methods, techniques and apparatuses for heat dissipation in power switches are disclosed. Further embodiments, forms, objects, features, advantages, aspects and benefits of the disclosure shall become apparent from the following description and drawings.

BRIEF DESCRIPTION OF THE DRAWINGS

FIGS. 3A-4B illustrate exemplary outer housings of an exemplary power switch.

FIG. 4 is a cross-section view illustrating another exemplary power switch.

DETAILED DESCRIPTION OF ILLUSTRATIVE EMBODIMENTS

Figure 1:
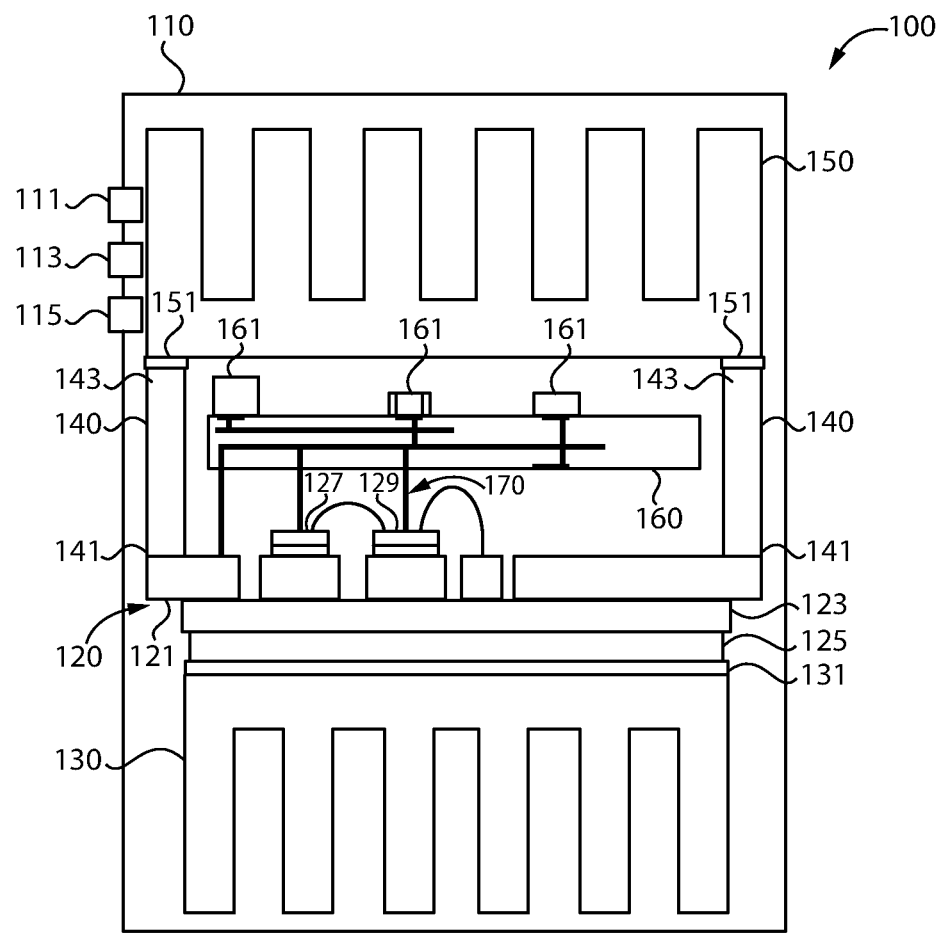
FIG. 1 is a cross-section view illustrating an exemplary power switch.

With reference to FIG. 1, there is a block diagram illustrating an exemplary power switch 100 structured to selectively conduct a current between a power source and a load. In certain embodiments, power switch 100 is structured to interrupt the current during a short circuit fault or another type of fault. It shall be appreciated that power switch 100 may take the form of a solid-state circuit breaker, solid-state transfer switch, solid-state disconnector switch, solid-state tie switch, or another type of solid-state switch structured to conduct current between a power source and a load. It shall also be appreciated that power switch 100 may be implemented in a variety of applications, including low voltage direct current (DC) systems, medium voltage DC systems, low voltage alternating current (AC) systems, medium voltage AC current systems, data centers, vehicular power systems, or marine power systems, to name but a few examples. In certain embodiments, low voltage DC may include any voltage less than 1500V; medium voltage DC may include any voltage between 1500V and 50 kV; low voltage AC may include any voltage less than 1000V; and medium voltage AC may include any voltage between 1000V and 72 kV.

Power switch 100 includes an outer housing 110, as well as a power electronics board 120, a control electronics board 160, heat sinks 130 and 150, a plurality of pin connectors 170, and a plurality of thermally conductive connectors 140, all disposed within outer housing 110. Power terminals 111 and 113 of outer housing 110 are structured to receive and output current conducted by power switch 100. In certain embodiments, power switch 100 is structured to conduct bidirectional current, such that power terminals 111 and 113 both receive and output current. Outer housing 110 also includes a communication terminal 115 structured to communicatively couple control electronics board 160 with an external device, such as a controller or a measuring device. In certain embodiments, housing 110 does not include communication terminal 115.

Power electronics board 120 is structured to selectively conduct current between power terminals 111 and 113. Board 120 includes a substrate, semiconductor switches 127 and 129, and a plurality of connectors 128. In the illustrated embodiment, the substrate of board 120 includes a direct bonded copper (DBC) substrate including a copper layer 121, a ceramic layer 123, and an aluminum layer 125. In certain embodiments, ceramic layer 123 may be replaced by a dielectric layer and aluminum layer 125 may be replaced with another copper layer. In certain embodiments, the substrate of board 120 may instead include an active metal braze substrate, an embedded substrate, an insulated metal substrate, or a printed circuit board, to name but a few examples.

Semiconductor switches 127 and 129 may include insulated gate bipolar transistors (IGBTs), bipolar junction transistors (BJTs), junction gate field-effect transistors (JFETs), silicon controlled rectifiers (SCRs), metal-oxide-semiconductor field-effect transistors (MOSFETs), gate turn-off thyristors (GTOs), MOS-controlled thyristors (MCTs), integrated gate-commutated thyristors (IGCTs), silicon carbide (SiC) switches, or gallium nitride (GaN) switches, to name but a few examples. In certain embodiments, board 120 includes more or fewer semiconductor switches. In certain embodiments, board 120 includes semiconductor switches coupled in series, coupled in parallel, coupled in anti-parallel, or a combination thereof. For example, board 120 may include anti-parallel coupled thyristors that are coupled in parallel with a SiC FET.

In the illustrated embodiment, the plurality of connectors 170 couple semiconductor switches 127 and 129 to each other and to the substrate. In other embodiments, board 120 may include more or fewer connectors or connectors arranged to connect different components of board 120.

The plurality of thermally conductive connectors 140 are structured to conduct heat between the substrate of board 120 and heat sink 150. The plurality of thermally conductive connectors 140 are comprised of thermally conductive material such as a metal or polymer, to name but a few examples. Each thermally conductive connector includes a first end 141 coupled to copper layer 121 of the substrate of power electronics board 120, and a second end 143 coupled to heat sink 150.

In certain embodiments, each of the plurality of thermally conductive connectors 140 may be a single solid piece or a plurality of pillars arranged in a row, to name but a few examples. The plurality of thermally conductive connectors 140 may each have a width within the range of 0.5 mm-7 mm, a height within the range of 1 mm-3 cm, and a length equal to or greater than the length of copper layer 121, to name but a few examples.

In certain embodiments, the plurality of thermally conductive connectors 140 and the substrate of power electronics board 120 are formed as one unit such that a fastener is not required to couple the plurality of thermally conductive connectors 140 and the substrate of power electronics board 120. In certain embodiments, the plurality of thermally conductive connectors 140 is coupled to the substrate of power electronics board 120 by way of solder film, glue, or screws, to name but a few examples. In the illustrated embodiment, the second ends 143 of the plurality of thermally conductive connectors 140 are coupled to heat sink 150 by way of fasteners 151, which may include one or more of thermal grease, solder film, glue, or screws, to name but a few examples.

The plurality of thermally conductive connectors 140 are sized such that heat sink 150, power electronics board 120, and the plurality of thermally conductive connectors 140 form an enclosure large enough for control electronics board 160 to be placed within the enclosure without components 161 making direct contact with heat sink 150. In certain embodiments, the enclosure is large enough that control electronics board 160 is not in contact with heat sink 150 or the plurality of thermally conductive connectors 140. In the illustrated embodiment, control electronics board 160 is oriented in parallel with the substrate of power electronics board 120, a base 133 of heat sink 130, and a base 153 of heat sink 150. In other embodiments, control electronics board 160 may be oriented differently relative to power electronics board 120 within the enclosure. In the illustrated embodiment, the plurality of thermally conductive connectors 140 are each oriented perpendicular to the substrate of power electronics board 120, base 133 of heat sink 130, and base 153 of heat sink 150, and the control electronics board 160. In other embodiments, one or more of the plurality of thermally conductive connectors 140 are oriented differently relative to power electronics board 120.

Heat sink 130 is coupled to a first side of power electronics board 120 opposite semiconductor switches 127 and 129 by way of a thermal grease and preform layer 137. Layer 137 is comprised of thermally conductive but electrically insulative material. Layer 137 is structured to eliminate air gaps or spaces from the interface area between layer 125 of power electronics board 120 and heat sink 130. In certain embodiments, a thermal grease and preform layer may be used between heat sink 150 and the second ends 143 of the plurality of thermally conductive connectors 140. In certain embodiments, power switch 100 does not include layer 137, and instead uses another type of fastener to couple heat sink 130 and power electronics board 120, such as solder film, glue, or screws. In the illustrated embodiment, heat sink 130 extends over the entire width of layer 125. In other embodiments, heat sink 130 extends over the entire width of the substrate of power electronics board 120.

Heat sink 130 is structured to dissipate a portion of the heat generated by power switch 100 from current conduction and semiconductor switch operation. However, due to the space and heat dissipation requirements of power switch 100, heat sink 130 is not able to dissipate enough of the heat generated by power electronics board 120 to maintain an internal temperature of power switch 100 below a threshold temperature, above which the internal temperature of power switch 100 exceeds the thermal ratings of at least one component of power switch 100. Heat sink 150 is structured to dissipate another portion of heat generated by power switch 100 from current conduction and semiconductor switch operation. In certain forms, one or more of heat sinks 130 and 150 may include a plurality of heat sinks coupled together, forming one heat sink.

Heat sinks 130 and 150 are collectively structured to dissipate heat such that the internal temperature of power switch 100 does not exceed the thermal ratings of any of the components of power switch 100, such as the thermal ratings for semiconductor switches 127 and 129, even during fault currents or repetitive switch toggling. To give another example, power electronics board 120 may be repeatedly toggled, at a frequency greater than 0.5 Hz, in order to control an electrical characteristic of the conducting current, such as the current magnitude. In response to determining power switch 100 is conducting a fault current, control electronics board 160 may repeatedly toggle semiconductor switches 127 and 129, generating an amount of heat that the first heat sink is not sized to dissipate alone while maintaining the internal temperature of power switch 100 below the thermal ratings of semiconductor switches 127 and 129.

It is important to note that if power switch 100 were to include only one of heat sink 130 and heat sink 150, power switch 100 would not be structured to conduct current up to the maximum current rating of power switch 100. For example, heat sink 130 is not sized to dissipate heat so as to maintain an internal temperature of power switch 100 below a semiconductor switch thermal rating of switch 127 or 129 while conducting current equal to the maximum current rating without heat sink 150.

Heat sinks 130 and 150 may be coupled within power switch 100 by soldering, sintering, gluing, or screwing into place, to name but a few examples. Heat sinks 130 and 150 may be sized to cover the whole area of power electronics board 120, or only a portion of it. For example, heat sinks 130 and 150 may extend across an entire distance of one dimension of the power electronics board 120 (e.g. its width), but fail to extend across an entire distance of another dimension of the power electronics board 120 (e.g. its length).

Control electronics board 160 is structured to monitor the current conducted by power switch 100, operate semiconductor switches 127 and 129 so as to interrupt or regulate the current conducted by power switch 100, and communicate with measuring devices of power switch 100 or with another type of external device. Such monitoring and/or control can occur though communication terminal 115 or the plurality of pin connectors 170 which may take any variety of forms, including but not limited to a pin, lead, or other type of conductive device, whether rigid or flexible such as a flexible connector, that electrically connects control electronics board 160 to power electronics board 120, to other locations of power switch 100, or to an external device.

Control electronics board 160 includes a plurality of components 161 coupled to a substrate 163. The plurality of components 161 may include digital circuitry, analog circuitry, or a combination thereof. For example, the plurality of components 161 may include one or more gate drivers structured to open and close semiconductor switches 127 and 129.

Substrate 163 is structured to mechanically support and interconnect the plurality of components 161. Substrate 163 may take the form of a printed circuit board, to name but one example. Substrate 163 may include a variety of arrangements including single sided (one copper layer), double sided (two copper layers on both sides of a substrate layer), or multi-layer, to set forth just a few non-limiting examples. Substrate 163 may be made from a variety of materials, such as phenolic paper, woven fiberglass, polyimide foils, and polyimide-fluoropolymer composite foils.

In the illustrated embodiment, control electronics board 160 is relatively flat having a relatively thin thickness and extending in a planar fashion. In certain forms, control electronics board 160 may include a variety of cross-sectional shapes as viewed in the direction of its thickness, including a square, a rectangular, or another polygonal shape. For example, in the schematic shown in FIG. 1, the shape of the control electronics board 160 is rectangular having a width along its larger dimension and a thickness along its shorter dimension. A length will be appreciated to extend into the planar view of FIG. 1. In some embodiments, the printed circuit board can be considered to extend along an elongate axis (e.g. along its length and/or width), where such elongate axes are located within the plane of the planar shaped substrate 163. Although substrate 163 may extend along each of three separate axes, as shown in the side views of the drawings, an elongate axis can be considered the axis of extension that includes a larger dimension than the other axis of extension.

As will be appreciated in context of the description above, each of power electronics board 120 and control electronics board 160 include various axes of extension, but it will be understood that some dimensions of the components include longer axes of extension as indicated in the drawings. It is the elongate axes of extension as supported by the drawings that are considered oriented at angles relative to one another. As can be seen, an elongate axis of extension of the control electronics board 160 is mounted in parallel to an elongate axis of extension of the power electronics board 120. Although control electronics board 160 is shown ordered above power electronics board 120, in certain forms control electronics board 160 may be located to the lateral side of power electronics board 160. In all embodiments though, control electronics board 160 is not in direct contact with heat sink 150 or the plurality of thermally conductive connectors 140.

One manner of constructing power switch 100 of any of the embodiments disclosed herein includes attaching heat sink 130 to a first side power electronics board 120, communicatively coupling power electronics board 120 to control electronics board 160, attaching first ends of the plurality of thermally conductive connectors 140 to a second side of the power electronics board 120, and attaching second ends of the thermally conductive connectors 140 to heat sink 150. It shall be appreciated that any or all of the foregoing features of power switch 100 may also be present in the other power switches disclosed herein.

Figure 2:
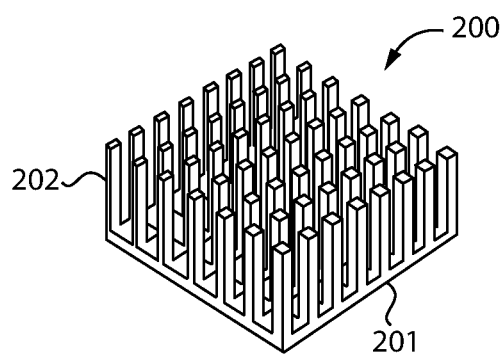
FIG. 2 illustrates an exemplary heat sink.

With reference to FIG. 2, there is illustrated an exemplary heat sink 200 of an exemplary power switch. Features of heat sink 200 described herein are included in other heat sinks described herein such as heat sinks 130 and 150 of power switch 100 in FIG. 1 and heat sinks 430 and 450 of power switch 400 in FIG. 4.

Heat sink 200 is structured to conduct heat generated by the components of power switch 100. Heat sink 200 may be comprised of a variety of materials using a variety of different manufacturing processes. For example, heat sink 200 may be comprised of metal or polymer, to name but a few examples. Heat sink 200 includes a base 201 from which extends a plurality of heat sink fins 202. Heat sink 200 may be made by bonding heat sink fins 202 to a base, folding fins 202 into shape and bonded, brazed, or soldered to base 201, stamping fins 202 and encapsulating with a die cast base 201, or skiving the plurality of fins 202 onto the base 201, to name but a few examples.

In the illustrated embodiment, base 201 has consistent thickness along the length and/or width of heat sink 200, but not all embodiments of heat sink 200 need include a base of constant thickness. Thus, base 201 of heat sink 200 may include an elongate axis of extension, which can be either its length or its width. Although heat sink 200 may extend along each of three separate axes, an elongate axis may be considered the axis of extension that includes a larger dimension than the other axis of extension.

The plurality of fins 202 may take a variety of forms such as pins, foils, and columns, to name but a few examples. In this regard, the plurality of fins 202 can have common cross-sectional shapes along their respective lengths, but not all embodiments of heat sink 200 need to have common shapes in all of the fins 202. Two or more different shapes are also contemplated for the fins 202.

The plurality of fins 202 may extend to a vertical height above base 201 of heat sink 200. In certain embodiments, all of the plurality of fins 202 may extend to a common height above base 201, but in other forms the plurality of fins 202 may extend to two or more different heights above base 201.

In certain forms, the plurality of fins 202 may be spaced apart equally along a dimension of base 201 (e.g. along its length and/or width), but not all forms need to include equi-spaced fins. In certain forms, the plurality of fins 202 may be equi-spaced in one portion of heat sink 200, while an open space is provided in another portion of heat sink 200 which is unoccupied by fins. Furthermore, embodiments of heat sink 200 in one exemplary power switch need not be made from the same materials and need not be made using the same manufacturing process. In short, embodiments of heat sink 200 in one exemplary power switch may be different from one another.

Figure 3A:
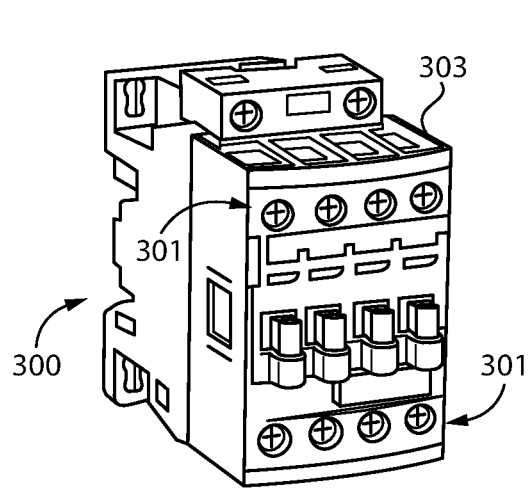
Figure 3B:
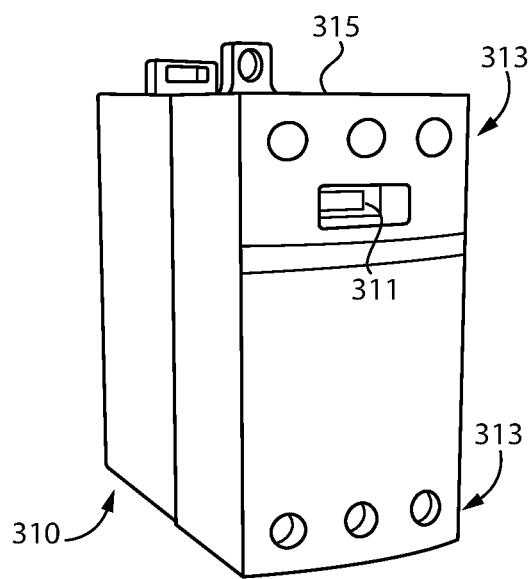

With reference to FIGS. 3A and 3B, there are illustrated two exemplary outer housings 300, 310 for exemplary power switches. Housing 300 includes a plurality of power terminals 301. Housing 310 including a plurality of power terminals 313 and communication terminal 311.

In applications having specific requirements in terms of space and dimensions, the development of a solid state breaker involves a challenge to design a device with miniaturized physical format and able to operate at high currents. Dimensions of the heat sinks and thermally conductive connectors are such that the dimensions of the outer housing are minimized to reduce one or more dimensions of the outer housing or reduce a volume of the outer housing. The package dimensions include a height, a width, and depth defined by the outer housing.

As illustrated in FIG. 3A, outer housing 300 includes a length of 75 mm, a width of 45 mm, and a depth of 45-90 mm, for a total volume ranging from 151.875 cubic centimeters to 303.75 cubic centimeters. In certain embodiments, outer housings 300 and 310 have a volume of less than 300 cubic centimeters.

Figure 4:
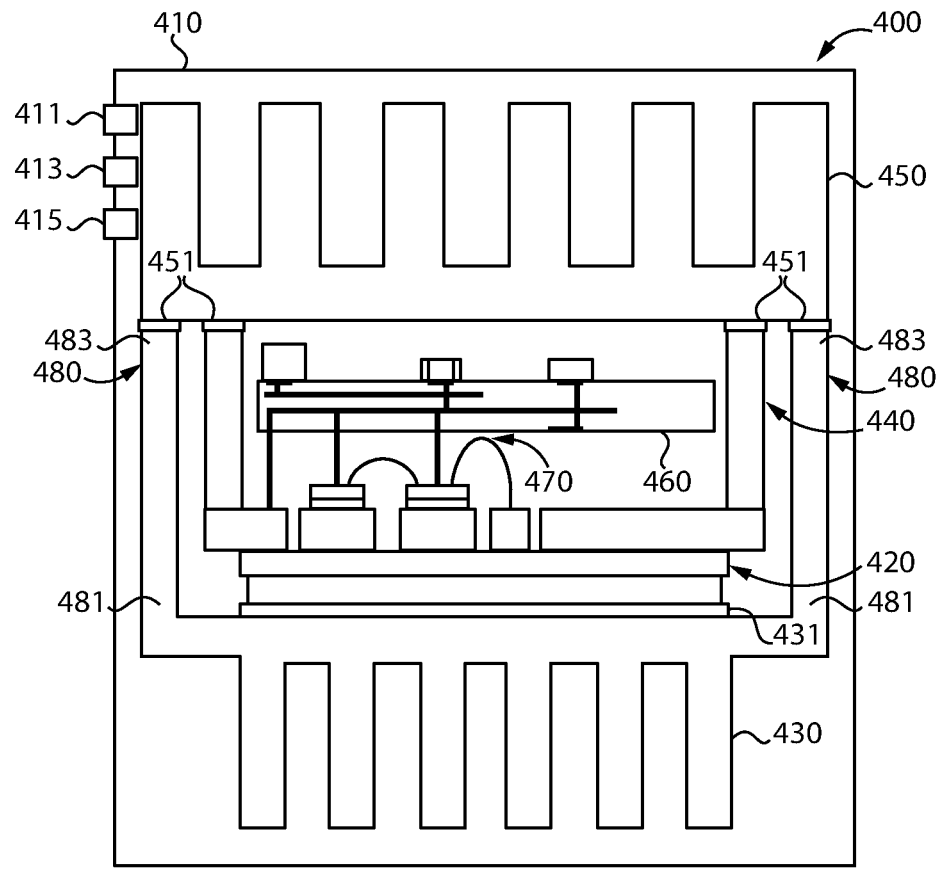

With reference to FIG. 4, there is a cross-section view of an exemplary power switch 400. It shall be appreciated that any or all of the foregoing features of power switch 100 may also be present in power switch 400.

Power switch 400 includes an outer housing 410 including power terminals 411 and 413, as well as communication terminal 415. Disposed within outer housing 410, power switch 400 includes power electronics board 420, heat sink 430, a plurality of thermally conductive connectors 440, heat sink 450, and control electronics board 460. Power electronics board 420 and heat sink 430 are coupled together by thermal grease 431.

In addition to the above components, which are also components included in power switch 100 in FIG. 1, power switch 400 includes a second plurality of thermally conductive connectors 480, each including a first end 481 coupled to heat sink 430, and a second end 483 coupled to heat sink 450. The second plurality of thermally conductive connectors 480 are structured to directly couple heat sink 430 with heat sink 450. It shall be appreciated that the described features of the thermally conductive connectors 140 in FIG. 1 also apply to the second plurality of thermally conductive connectors 480. It shall be appreciated that any or all of the foregoing features of power switch 400 may also be present in the other power switches disclosed herein.

Further written description of a number of exemplary embodiments shall now be provided. One embodiment is a power switch comprising: an outer housing including a first power terminal and a second power terminal; a power electronics board disposed within the outer housing and including a semiconductor switch structured to selectively conduct a current between the first power terminal and the second power terminal; a first heat sink coupled to a first side of the power electronics board; a plurality of thermally conductive connectors each including a first end coupled to a second side of the power electronics board, the second side of the power electronics board being opposite the first side of the power electronics board; a second heat sink coupled to a second end of each of the plurality of thermally conductive connectors; and a control electronics board structured to control the semiconductor switch, the control electronics board being located within an enclosure formed of the second heat sink, the plurality of thermally conductive connectors, and the power electronics board.

In certain forms of the foregoing power switch, the power electronics board includes a direct bonded copper substrate and the control electronics board including a plurality of components coupled to a printed circuit board. In certain forms, the control electronics board is not in direct contact with the second heat sink or the plurality of thermally conductive connectors. In certain forms, the power electronics board includes a substrate, and the first end of each of the plurality of thermally conductive connectors are coupled to the substrate. In certain forms, the control electronics board and the power electronics board are coupled by way of a plurality of pin connectors. In certain forms, a volume of the outer housing is less than 300 cubic centimeters. In certain forms, the power switch is structured to repeatedly toggle the semiconductor switch in response to determining the power switch is conducting a fault current, and wherein the first heat sink is not sized to maintain an internal temperature of the power switch below a semiconductor switch thermal rating while repeatedly toggling the semiconductor switch. In certain forms, the power switch includes a maximum current rating, and wherein the first heat sink is not sized to maintain an internal temperature of the power switch below a semiconductor switch thermal rating while conducting current equal to the maximum current rating without the second heat sink. In certain forms, the power switch comprises a second plurality of thermally conductive connectors coupled between the first heat sink and the second heat sink. In certain forms, the second end of each of the plurality of thermally conductive connectors is coupled to the second heat sink using solder film, glue, or a screw.

Another exemplary embodiment is a method for constructing a power switch comprising: attaching a first heat sink to a first side of a power electronics board including a semiconductor switch structured to selectively conduct a current between a first power terminal and a second power terminal, communicatively coupling the power electronics board to a control electronics board, attaching a plurality of thermally conductive connectors to a second side of the power electronics board, attaching the thermally conductive connectors to a second heat sink, such that the first heat sink, the power electronics board, and the plurality of thermally conductive connectors form an enclosure, and disposing the first heat sink, the power electronics board, and the plurality of thermally conductive connectors, and the second heat sink within an outer housing, wherein the control electronics board is located within the enclosure.

In certain forms of the foregoing method, the power electronics board includes a direct bonded copper substrate and the control electronics board including a plurality of components coupled to a printed circuit board. In certain forms, the control electronics board is located not in direct contact with the second heat sink or the plurality of thermally conductive connectors. In certain forms, the power electronics board includes a substrate, and each of the plurality of thermally conductive connectors are attached to the substrate. In certain forms, the control electronics board and the power electronics board are coupled by way of a plurality of pin connectors. In certain forms, a volume of the outer housing is less than 300 cubic centimeters. In certain forms, the method comprises determining the power switch is conducting a fault current, repeatedly toggling the semiconductor switch, wherein the first heat sink is not sized to maintain an internal temperature of the power switch below a semiconductor switch thermal rating while repeatedly toggling the semiconductor switch. In certain forms, the power switch includes a maximum current rating, and wherein the first heat sink is not sized to maintain an internal temperature of the power switch below a semiconductor switch thermal rating while conducting current having a magnitude of the maximum current rating without the second heat sink. In certain forms, the method comprises a second plurality of thermally conductive connectors directly coupled between the first heat sink and the second heat sink. In certain forms, attaching the plurality of thermally conductive to the second heat sink includes using solder film, glue, or a screw.

While the present disclosure has been illustrated and described in detail in the drawings and foregoing description, the same is to be considered as illustrative and not restrictive in character, it being understood that only certain exemplary embodiments have been shown and described, and that all changes and modifications that come within the spirit of the present disclosure are desired to be protected. It should be understood that while the use of words such as "preferable," "preferably," "preferred" or "more preferred" utilized in the description above indicate that the feature so described may be more desirable, it nonetheless may not be necessary, and embodiments lacking the same may be contemplated as within the scope of the present disclosure, the scope being defined by the claims that follow. In reading the claims, it is intended that when words such as "a," "an," "at least one," or "at least one portion" are used there is no intention to limit the claim to only one item unless specifically stated to the contrary in the claim. The term "of" may connote an association with, or a connection to, another item, as well as a belonging to, or a connection with, the other item as informed by the context in which it is used. The terms "coupled to," "coupled with" and the like include indirect connection and coupling, and further include but do not require a direct coupling or connection unless expressly indicated to the contrary. When the language "at least a portion" and/or "a portion" is used, the item can include a portion and/or the entire item unless specifically stated to the contrary.

What is claimed is:

1. A power switch comprising:
    an outer housing including a first power terminal and a second power terminal;
    a power electronics board disposed within the outer housing and including a semiconductor switch structured to selectively conduct a current between the first power terminal and the second power terminal;
    a first heat sink coupled to a first side of the power electronics board;
    a plurality of thermally conductive connectors each including a first end coupled to a second side of the power electronics board, the second side of the power electronics board being opposite the first side of the power electronics board;
    a second heat sink coupled to a second end of each of the plurality of thermally conductive connectors; and
    a control electronics board structured to control the semiconductor switch, the control electronics board being substantially located within an enclosure formed of the second heat sink, the plurality of thermally conductive connectors, and the power electronics board.

2. The power switch of claim 1, wherein the power electronics board includes a direct bonded copper substrate and the control electronics board including a plurality of components coupled to a printed circuit board.

3. The power switch of claim 1, wherein the control electronics board is not in direct contact with the second heat sink or the plurality of thermally conductive connectors.

4. The power switch of claim 1, wherein the power electronics board includes a substrate, and the first end of each of the plurality of thermally conductive connectors are coupled to the substrate.

5. The power switch of claim 1, wherein the control electronics board and the power electronics board are coupled by way of a plurality of pin connectors.

6. The power switch of claim 1, wherein a volume of the outer housing is less than 300 cubic centimeters.

7. The power switch of claim 6, wherein the power switch is structured to repeatedly toggle the semiconductor switch in response to determining the power switch is conducting a fault current, and wherein the first heat sink is not sized to maintain an internal temperature of the power switch below a semiconductor switch thermal rating while repeatedly toggling the semiconductor switch.

8. The power switch of claim 6, wherein the power switch includes a maximum current rating, and wherein the first heat sink is not sized to maintain an internal temperature of the power switch below a semiconductor switch thermal rating while conducting current equal to the maximum current rating without the second heat sink.

9. The power switch of claim 1, comprising a second plurality of thermally conductive connectors coupled between the first heat sink and the second heat sink.

10. The power switch of claim 1, wherein the second end of each of the plurality of thermally conductive connectors is coupled to the second heat sink using solder film, glue, or a screw.

11. A method for constructing a power switch comprising:
    attaching a first heat sink to a first side of a power electronics board including a semiconductor switch structured to selectively conduct a current between a first power terminal and a second power terminal,
    communicatively coupling the power electronics board to a control electronics board,
    attaching a plurality of thermally conductive connectors to a second side of the power electronics board,
    attaching the thermally conductive connectors to a second heat sink, such that the second heat sink, the power electronics board, and the plurality of thermally conductive connectors form an enclosure, and
    disposing the first heat sink, the power electronics board, and the plurality of thermally conductive connectors, and the second heat sink within an outer housing,
    wherein the control electronics board is located substantially within the enclosure.

12. The method of claim 11, wherein the power electronics board includes a direct bonded copper substrate and the control electronics board including a plurality of components coupled to a printed circuit board.

13. The method of claim 11, wherein the control electronics board is located not in direct contact with the second heat sink or the plurality of thermally conductive connectors.

14. The method of claim 11, wherein the power electronics board includes a substrate, and each of the plurality of thermally conductive connectors are attached to the substrate.

15. The method of claim 11, wherein the control electronics board and the power electronics board are coupled by way of a plurality of pin connectors.

16. The method of claim 11, wherein a volume of the outer housing is less than 300 cubic centimeters.

17. The method of claim 16, comprising:
    determining the power switch is conducting a fault current; and
    repeatedly toggling the semiconductor switch,
    wherein the first heat sink is not sized to maintain an internal temperature of the power switch below a semiconductor switch thermal rating while repeatedly toggling the semiconductor switch.

18. The method of claim 16, wherein the power switch includes a maximum current rating, and wherein the first heat sink is not sized to maintain an internal temperature of the power switch below a semiconductor switch thermal rating while conducting current having a magnitude of the maximum current rating without the second heat sink.

19. The method of claim 11, comprising a second plurality of thermally conductive connectors directly coupled between the first heat sink and the second heat sink.

20. The method of claim 11, wherein attaching the plurality of thermally conductive connectors to the second heat sink includes using solder film, glue, or a screw.

* * * * *